(12) United States Patent
van der Goes

(10) Patent No.: US 9,077,355 B2
(45) Date of Patent: Jul. 7, 2015

(54) SWITCHED CAPACITANCE CONVERTER

(71) Applicant: Broadcom Corporation, Irvine, CA (US)

(72) Inventor: Frank Maria Leonardus van der Goes, The Hague (NL)

(73) Assignee: Broadcom Corporation, Irvine, CA (US)

( * ) Notice: Subject to any disclaimer, the term of this patent is extended or adjusted under 35 U.S.C. 154(b) by 69 days.

(21) Appl. No.: 14/030,037

(22) Filed: Sep. 18, 2013

(65) Prior Publication Data

US 2015/0054668 A1 Feb. 26, 2015

Related U.S. Application Data

(60) Provisional application No. 61/867,699, filed on Aug. 20, 2013.

(51) Int. Cl.
*H03M 1/12* (2006.01)
*H03M 1/00* (2006.01)
*H03M 1/40* (2006.01)

(52) U.S. Cl.
CPC .............. *H03M 1/002* (2013.01); *H03M 1/403* (2013.01)

(58) Field of Classification Search
CPC ......... H03M 1/38; H03M 1/40; H03M 1/403; H03M 1/46; H03M 1/462; H03M 1/466
USPC .................................................. 341/163, 172
See application file for complete search history.

(56) References Cited

U.S. PATENT DOCUMENTS

| 5,684,487 | A | * | 11/1997 | Timko | 341/172 |
| 6,118,400 | A | * | 9/2000 | Susak | 341/172 |
| 7,605,741 | B2 | * | 10/2009 | Hurrell | 341/163 |
| 8,164,504 | B2 | * | 4/2012 | Cho et al. | 341/172 |

OTHER PUBLICATIONS

Choi, et al., A Low Energy Two-step Successive Approximation Algorithm for ADC design, IEEE International Symposium on Circuits and Systems, May 24-27, 2009, 4 pages.

* cited by examiner

*Primary Examiner* — Khai M Nguyen
(74) *Attorney, Agent, or Firm* — Brinks Gilson & Lione

(57) ABSTRACT

A system includes a first capacitor group to facilitate determination of a first bit, and a second capacitor group to facilitate determination of a second bit in combination with the first capacitor group. The system further includes a delayed clock switch to engage the second capacitor group after determination of the first bit.

20 Claims, 17 Drawing Sheets

| bit | value | midcode | 1 | 2 | 3 | 4 | 5 | 6 | 7 | 8 | 9 |
|---|---|---|---|---|---|---|---|---|---|---|---|
| 8 | 56 | "10" | "11/00" | "11/00" | "11/00" | "11/00" | "11/00" | "11/00" | "11/00" | "11/00" | "11/00" |
| 7 | 32 | "10" | "10" | "11/00" | "11/00" | "11/00" | "11/00" | "11/00" | "11/00" | "11/00" | "11/00" |
| 6 | 18 | "10" | "10" | "10" | "11/00" | "11/00" | "11/00" | "11/00" | "11/00" | "11/00" | "11/00" |
| 5 | 10 | "10" | "10" | "10" | "10" | "11/00" | "11/00" | "11/00" | "11/00" | "11/00" | "11/00" |
| 4 | 6 | "10" | "10" | "10" | "10" | "10" | "11/00" | "11/00" | "11/00" | "11/00" | "11/00" |
| 3 | 3 | "10" | "10" | "10" | "10" | "10" | "10" | "11/00" | "11/00" | "11/00" | "11/00" |
| 2 | 2 | "10" | "10" | "10" | "10" | "10" | "10" | "10" | "11/00" | "11/00" | "11/00" |
| 1 | 1 | "10" | "10" | "10" | "10" | "10" | "10" | "10" | "10" | "11/00" | "11/00" |
| 0 | 1 | "00" | "00" | "00" | "00" | "00" | "00" | "00" | "00" | "00" | "11/00" |
| fixed | 1 | | | | | | | | | | |
| DAC size | 131 | 131 | 131 | 131 | 131 | 131 | 131 | 131 | 131 | 131 | 131 |

F: floating

US 9,077,355 B2

SWITCHED CAPACITANCE CONVERTER

PRIORITY CLAIM

This application claims priority to U.S. Provisional Application Ser. No. 61/867,699, filed Aug. 20, 2013, which is incorporated herein by reference in its entirety.

TECHNICAL FIELD

This disclosure relates generally to signal sampling systems and methods. It also relates to a hybrid pipeline analog-to-digital receiver to reduce power consumption during signal conversion.

BACKGROUND

An analog-to-digital converter (ADC) includes an electronic device that receives an analog signal. The analog-to-digital converter samples the received signal and outputs a signal representing a digital value. The digital value may be acquired in operations whose outputs represent a number of bits. The ADC may be used to sample a variety of analog waveforms in the form of radio-frequency wave, sound waves, or voltage signal.

BRIEF DESCRIPTION OF THE DRAWINGS

The innovation may be better understood with reference to the following drawings and description. In the figures, like reference numerals can designate corresponding parts throughout the different views.

FIG. 13 is a table of capacitor positions for an example split-capacitance SAR.

FIG. 14 is a table of capacitor positions for an example split capacitance SC-DAC SAR.

DETAILED DESCRIPTION

An analog-to-digital converter (ADC) may operate to sample analog waveforms to produce digital representations. Successive-approximation-register (SAR) ADCs may use a binary search algorithm to identify the sampled voltage/amplitude range. A SAR ADC may use a series of capacitors to sample the input signal and to provide proper weights to the successive bits.

The initial SAR stages may use large capacitances than successive stages. In some cases, the power drawn by larger capacitors may be large than that drawn by smaller capacitors. For example, to achieve a given voltage across a capacitor more charge may be stored in the capacitor. More current may follow to support the greater charge storage. Further, the voltages sampled in the initial steps may be greater (e.g. coarse determination). Increased voltage and current flow may result in more power consumption. Larger capacitors may have smaller sensitivities to sources of error (e.g. noise, etc.). Increased voltage and current flow may reduce sensitivity to error because a given source may have a smaller proportional response.

Figure 1:
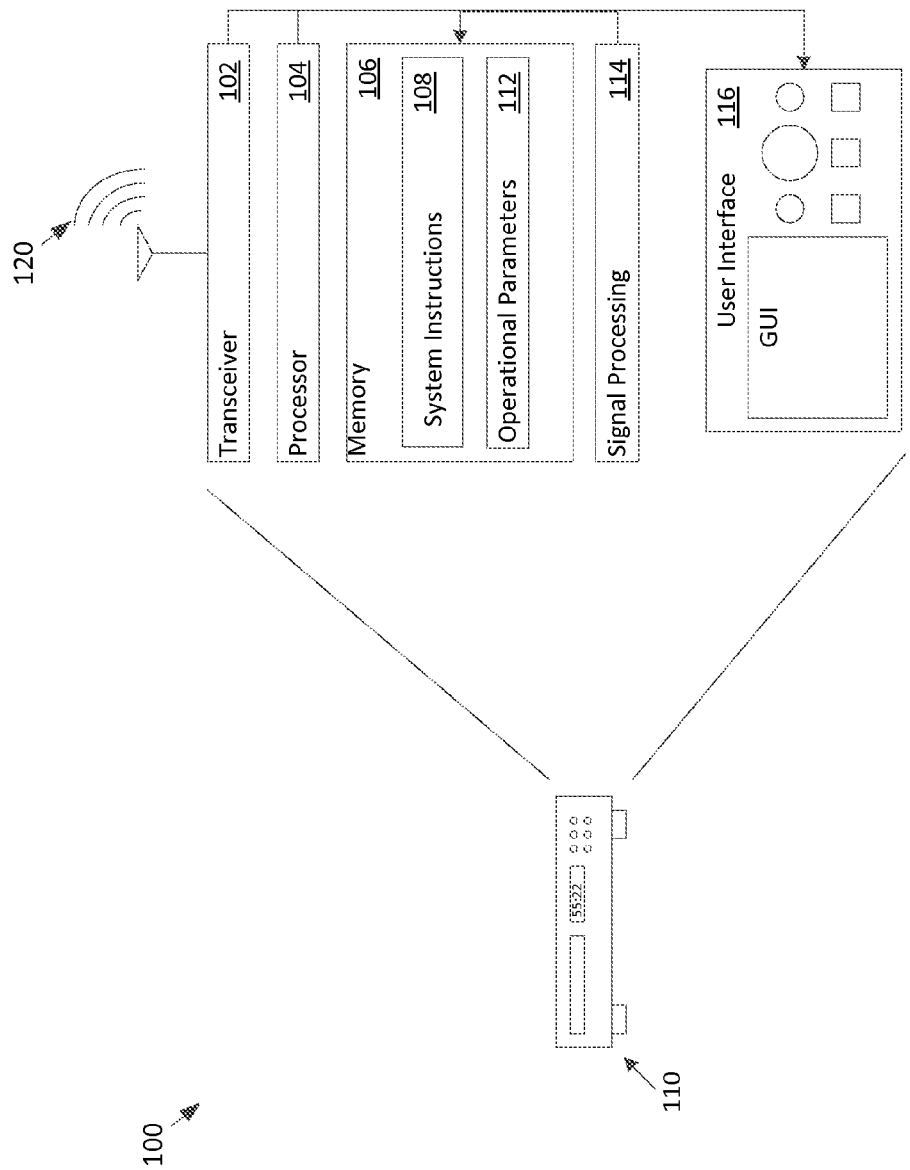
FIG. 1 is a block diagram of an example sampling system environment.

FIG. 1 is a block diagram of an example sampling system environment. In this sampling system environment 100, an RF device 110 receives an analog waveform 120, which is sampled to produce a digital representation of the waveform. In one example, the RF device is a communication device, such as a cell phone, smartphone, tablet, laptop, or a portable gaming system. However, the RF device may be virtually any device implementing analog-to-digital (A2D) conversion of a signal or digital-to-analog conversion of a signal. For example, cable or satellite television set-top boxes (STBs), network interface cards (NICs), or modems may use such conversion capabilities. The waveform may be sent in the form of a wireless communication (i.e. a signal encoded onto a free-space electromagnetic field) or sent over a wireline connection.

The RF device 110 may include transceiver elements 102 to support RF communication, one or more processors 104 to support execution of applications and general operation of the device. The device may include memory 106 for execution support and storage of system instructions 108 and operation parameters 112. Signal processing hardware 114 (e.g. ADC, baseband processors etc.) may also be included to support decoding/encoding RF signaling. The communication device may include a user interface 116 to allow for user operation of the RF device.

Figure 2:
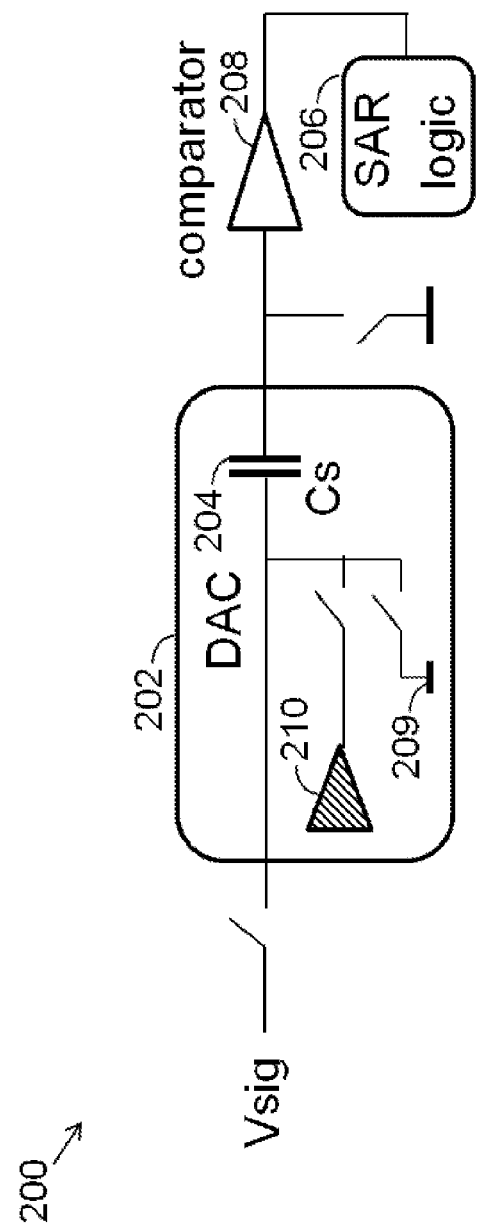
FIG. 2 is a circuit diagram of an example successive-approximation-register (SAR) analog-to-digital converter (ADC) with static capacitance.

FIG. 2 is a circuit diagram of an example SAR ADC 200 with static capacitance. The SAR ADC 200 may sample an input voltage (Vsig) and determine a set of bits which representative of Vsig at the time of sampling. The SAR ADC 200 may include a static capacitance digital-to-analog converter (DAC) 202. The static capacitance DAC 202 may use a group 204 of capacitors to apply relative weight to output bits of the SAR ADC. The ratios of the capacitances of the capacitors in the group 204 may determine the relative weights of the bits. For example, a binary SAR may be used in which capacitors associated with successive bit have twice the capacitance of capacitors associated with the preceding bits (e.g. C, 2 C, 4 C, 8 C ... $2^N$ C). The growth factor may be called a radix. Other radix may be used. For example, a system with a radix of 1.72 may be used (e.g. C, 1.72 C, ... $1.72^N$ C). In some cases, the radix may be approximate or an average radix. For example, the ratio of capacitors may be adjusted to allow for integer capacitances (e.g. C, 2 C, 3 C, etc.). In some implementations, a system with such a factor less than 2 may implement error correction. The SAR logic 206 may control the timing to ensure the proper ordering of bits. The comparator 208 may be used in determining when a "1" or a "0" may be assigned for a bit. The capacitors in the group 204 may be switched to ground 209 or to a reference buffer 210 depending on the determination of "1" or "0". In some cases, larger capacitors in the group 204 may draw more power from the reference buffer 210 when switched.

Figure 3:
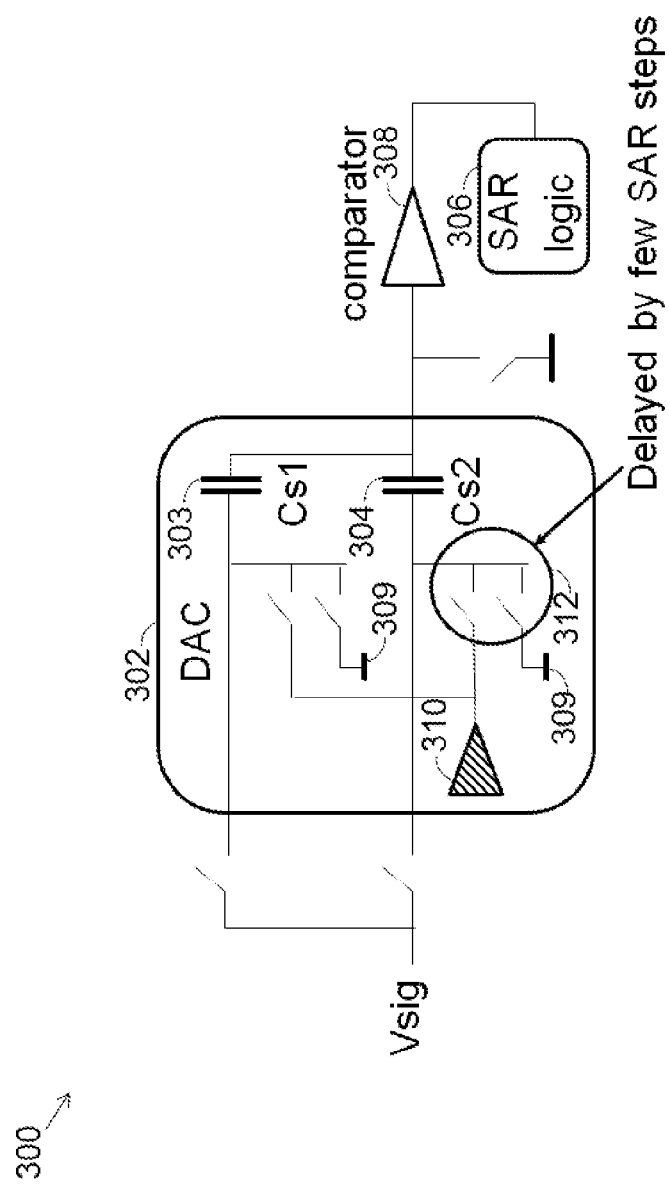
FIG. 3 is circuit diagram of an example SAR ADC with switched capacitance.

FIG. 3 is circuit diagram of an example SAR ADC 300 with switched capacitance. The SAR ADC 300 may include a switched-capacitance DAC 302 (SC-DAC). The SAR ADC 300 may determine a bit representation of an input voltage (Vsig). The SC-DAC 302 may include two parallel groups 303, 304 of capacitors. The Cs1 group 303 may include capacitors associated with the first few bits. The Cs2 group 304 may include capacitors associated with the first few bits and capacitors associated with the remaining bits. For acquisition of the first few bits capacitors in the Cs2 group 304 may be allowed to float. The engagement switches 312 for capacitors in the Cs2 group 304 may be off for measurement of the first few bits. In some cases, the Cs2 group 304 may include reference capacitors which may be engaged (i.e. associated engagement switches 312 on) for the first few bits, while others of the Cs2 group may be disengaged (i.e. allowed to float). The engagement switches may be turned on after a delay of a few SAR steps.

The SAR logic 306 may maintain the timing and ensure proper bit order. In some implementations, the SAR logic 306 may control the engagement switches. The comparator 308 may be used in determining whether a "1" (logical high) or a "0" (logical low) may be assigned for a bit. In some cases, the comparator output may be used to determine if a capacitor in one or both of the groups 303, 304 may be switched.

The capacitors in the Cs1 group 303 associated with the first few bits may be have some portion of the combined capacitance of the capacitors in the Cs1 and Cs2 groups 303, 304 associated with the first few bits. For example, the Cs1 group 303 may include a capacitor (MC1) associated with a most significant bit (MSB) and the Cs2 group 304 may include a capacitor (MC2) associated with the MSB. When MC1 and MC2 are engaged they may be situated in parallel. In some implementations MC1 may have a capacitance that is a fraction (e.g. ¾, ½, ¼, ⅕, ⅛, 1/16, etc.) of the total capacitance of MC1 and MC2. For determination of the MSB, MC2 may be allowed to float. MC2 may not draw power from the reference buffer 310. MC1 may be switched during the determination of the MSB. MC1 may have a smaller capacitance than the combined capacitance of MC1 and MC2 in parallel. While switching, MC1 may draw less power than would be drawn by MC1 and MC2 were both capacitors engaged.

Additionally or alternatively, speed increases may be associated with reduced capacitance. For example, the system with MC1 engaged may cycle faster than a SAR with MC1 and MC2 engaged. In some cases, the settling time of the reference buffer may determine (in part) the cycling time of the SAR. For example if the settling time of the reference buffer is 50% of the total SAR cycling period, a 50% reduction in capacitance may result in a 25% total SAR speed increase.

In the example, a determination based on MC1 may be more sensitive to noise (and/or other sources of error) than a determination based MC1 and MC2 in parallel. In some cases, MSBs and others of the first bits determined may have a comparatively large signal-to-noise ratio (SNR) (e.g. when compared to the least significant bit (LSB) and/or other later determined bits). MSBs and others of the first bits determined may not use the low noise sensitivity of a large capacitor.

The capacitors in the groups 303, 304 may be groups of capacitors. For example individual capacitors may include groups of parallel unitary capacitors (fingers). In this case, the relative capacitances of capacitors may be determined by the number of fingers making up the capacitors (e.g. a capacitor with 2 fingers may have ⅔ of the capacitance of a capacitor with 3 fingers).

Figure 4:
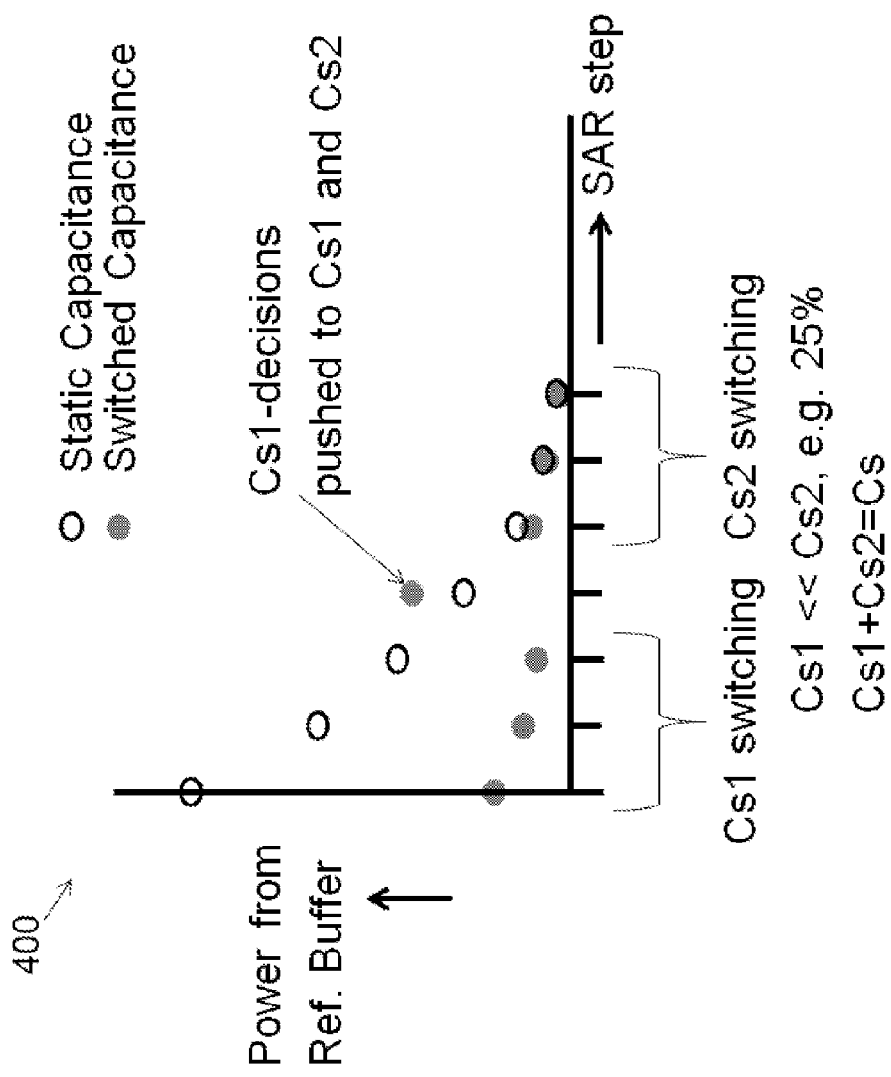
FIG. 4 is an example plot of power usage versus step.

FIG. 4 is an example plot 400 of power usage versus step. In the example plot 400, the power usage by an example static capacitance SAR is plotted on the same axis as an example SC-DAC. The example static capacitance SAR may have the same bit sizes as the SC-DAC. In some implementations, the static capacitance SAR may draw more power from the reference buffer in for the first few steps.

Figure 5:
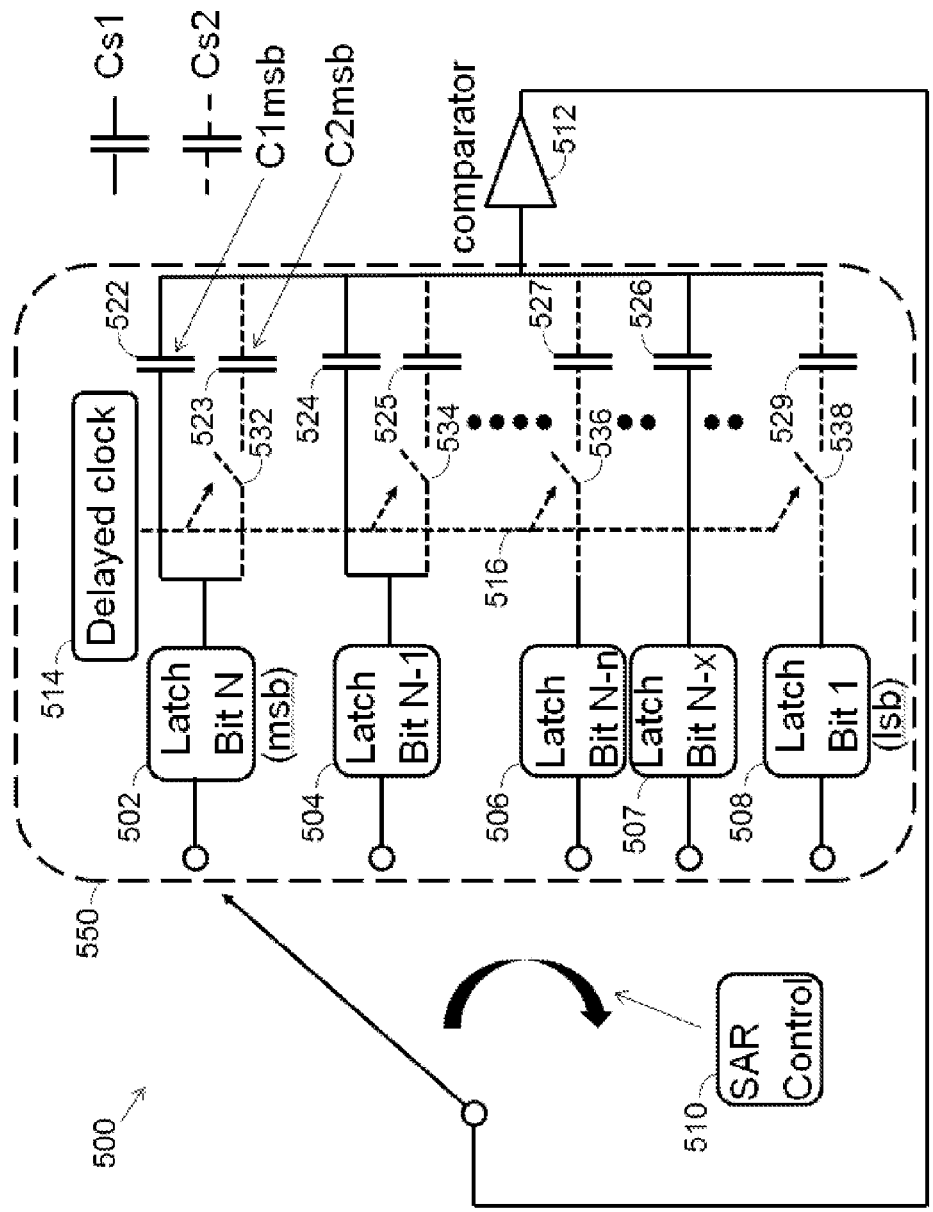
FIG. 5 is a circuit diagram of an example switched-capacitance digital-to-analog converter (SC-DAC) SAR.

FIG. 5 is a circuit diagram of an example SC-DAC SAR 500. The SC-DAC 550 includes latches 502, 504, 506, 507, 508 associated with bits of the SAR 500. The latches 502, 504, 506, 507, 508 drive capacitors 522, 523, 524, 525, 526, 527, 529 from groups Cs1 and Cs2. As discussed above, capacitors 522, 523, 524, 525, 526, 527, 529 may include groups of parallel small capacitors (e.g. fingers). A latch 502, 504, 506, 507, 508 may drive a capacitor 522, 524, 526 from group Cs1 and a capacitor 523, 525, 527, 529 from group Cs2. A capacitor 522, 524 from group Cs1 and a capacitor 523, 525 from group Cs2 may be arranged in parallel and driven by a common latch 502, 504. Capacitors 523, 525, 527, 529 from group Cs2 may be allowed to float for a number (e.g. n) of SAR steps. The delayed clock 514 may implement a switching signal 516 to turn on switches 532, 534, 536, 538 associated with the Cs2 group capacitors for SAR operation.

In some implementations, a capacitor 522 (e.g. C1msb) of group Cs1 may have a ratio with the total capacitance of group Cs1 that is the same as the ratio of the capacitor and an associated capacitor 523 (e.g. C2msb) of group Cs2 with the total capacitance of Cs1 and Cs2:

$$\frac{cap(C1msb)}{cap(Cs1)} \simeq \frac{cap(C1msb + C2msb)}{cap(Cs1 + Cs2)}$$

In some cases, these ratios may facilitate the maintenance of ratios following the engagement of the capacitors of group Cs2. In various implementations, capacitors 526 driven by latches 507 not associated the first number of bits may be included in group Cs1. These capacitors not associated with the first number of bit may facilitate the maintenance of the capacitance ratio. Additionally or alternatively, capacitors not associated with bits of the SAR (not shown) may be included in group Cs1 to facilitate capacitance ratio maintenance. Capacitors not associated with the bits of the SAR may be disengaged when group Cs2 is engaged.

In some implementations, the two ratios described above may be similar to within a tolerance. For example the different in the ratios may be up to a predetermined percentage of the value of the ratio (e.g. 0.1%, 1%, 2%, 10%, etc.). Additionally or alternatively, the tolerance may include a maximum difference (e.g. (unitary capacitance)/(total capacitance of system), etc.). In some implementations, external system constraints and/or performance objectives (e.g. accuracy, resolution, etc.) may affect the tolerance.

The SAR controls 510 may control operation of the SAR (e.g. timing, switching, bit assignment, etc.). The output of the comparator may be used to determine assignment of a "1" or "0" to a bit.

Figure 6:
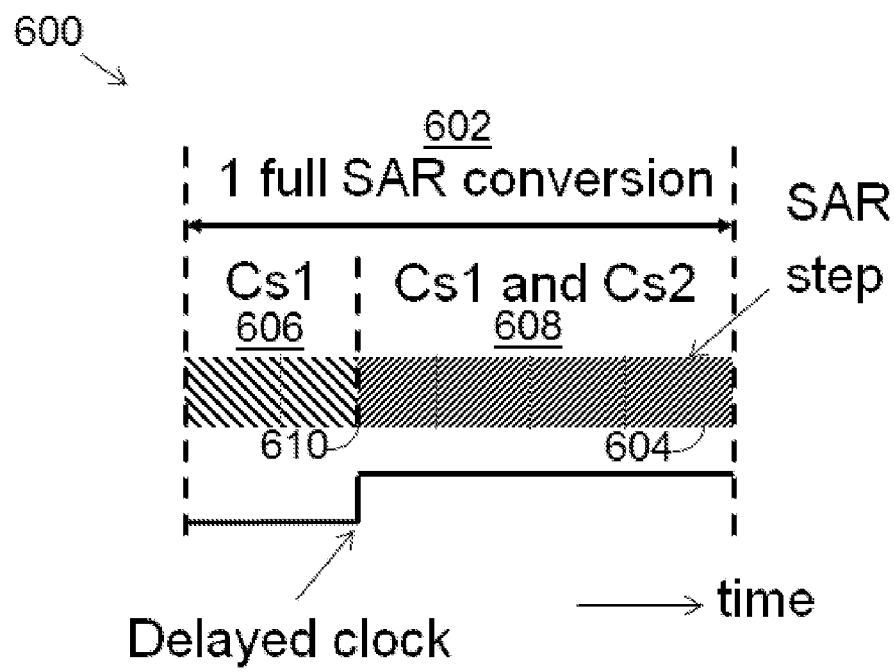
FIG. 6 is a timing diagram for an example SC-DAC SAR system.

FIG. 6 is a timing diagram 600 for an example SC-DAC SAR system. A full SAR conversion frame 602 may include SAR steps 604 and two phases 606, 608. In a first phase 606, capacitors of group Cs1 may be engaged. In the second phase 606, capacitors of group Cs1 and Cs2 may be engaged. The phases may be separated by a delayed clock event 610, which may signal engagement of group Cs2 capacitors. Additionally or alternatively, phases beyond a first and second may be implemented. In some cases, further groups of capacitors (e.g. Cs3, Cs4, etc.) may be successively engaged by delayed clock signals. For example, a 12-bit SAR system may implement a SC-DAC with 3 phases and 3 groups of capacitors.

Figure 7:
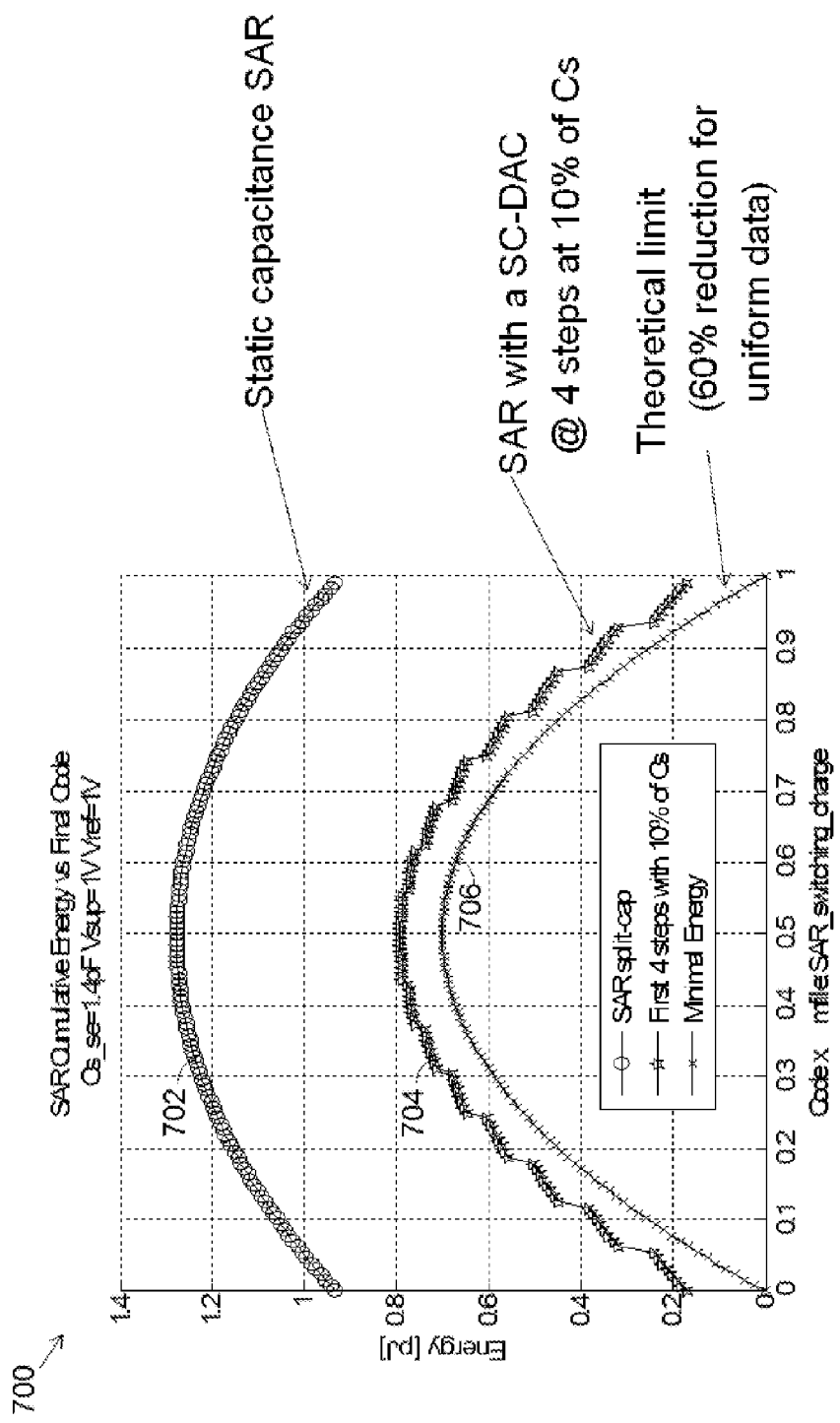
FIG. 7 is a plot of power usage for example SAR systems.

FIG. 7 is a plot 700 of power usage for example SAR systems. An example static capacitance SAR implementing a split-cap design is associated with curve 702. An example SAR with a SC-DAC is associated with curve 704. For the example SC-DAC SAR the first 4 MSBs are determined using 10% of the total capacitance. A theoretical limit of the gains that may be achieved through a SC-DAC is associated with curve 706. The theoretical limit is associated with uniform data and may correspond to a 60% reduction in power compared to a similar static capacitance system. For non-uniform data, the curve 704 of the SC-DAC SAR may be closer to the theoretical limit than the example static capacitance SAR implementing a split-cap design (702).

Figure 8:
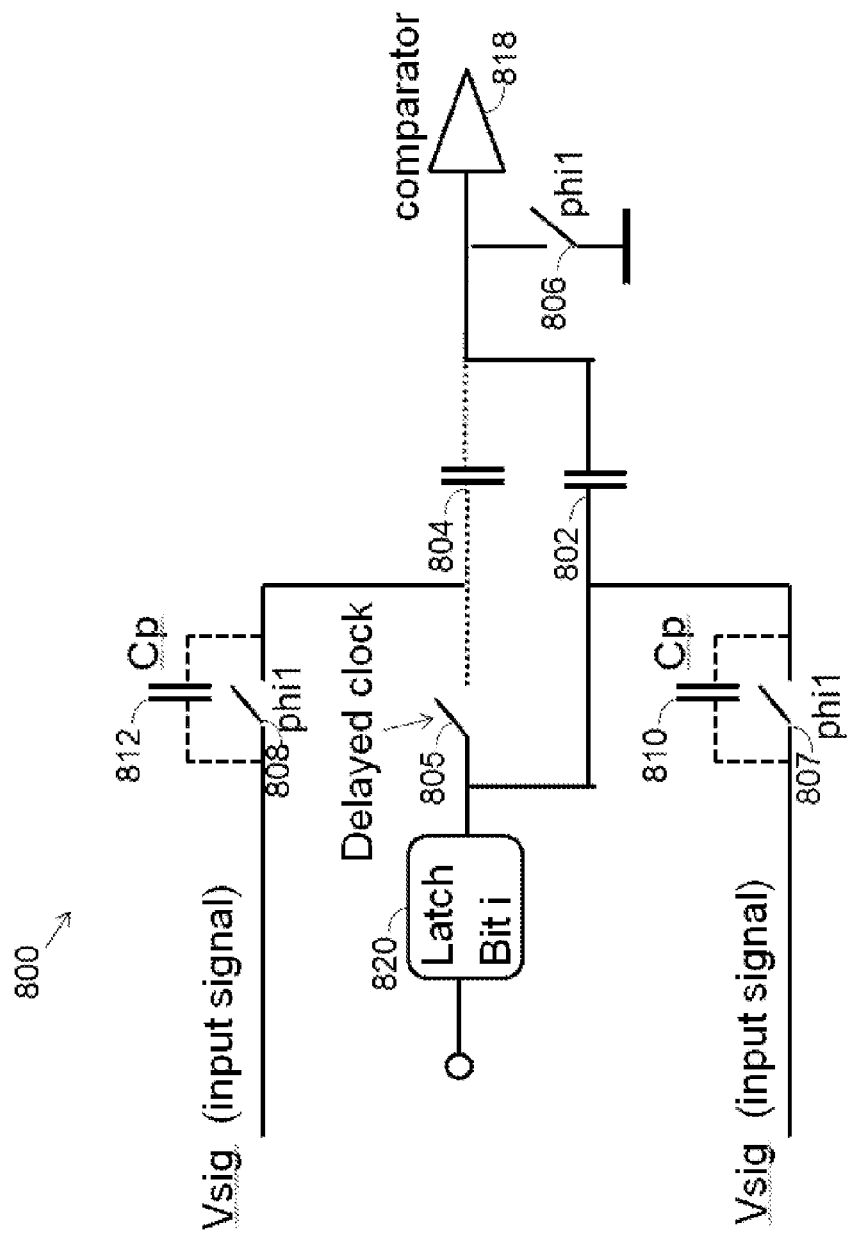
FIG. 8 is a circuit diagram of an example SC-DAC.

FIG. 8 is a circuit diagram of an example SC-DAC 800. In the example SC-DAC 800, for a latch 820 may drive a capacitor pair in which a portion 802 of the circuit with a first (e.g. a member of group Cs1) of the capacitor pair is engaged prior to a delayed clock signal, and another portion 802 of circuit with a second (e.g. a member of group Cs2) of the capacitor pair is floating prior to a delayed clock signal. After a number of SAR steps the delayed clock may engage switch 805. During a tracking phase (phi1), switches 806, 807, 808 are engaged and are disengaged during the measurement phase. In some cases, disengaged switches 807, 808 may act as parasitic capacitors 812, 810 (Cp). Vsig may leak across Cp. In some cases, the leak across 807 may have little effect on 802. The leak across 808 may have an effect while 805 is disengaged. In some implementations the capacitor of portion 804 may be larger than the capacitor of 802. Determinations based on the capacitor of portion 802 may be more sensitive to noise contributions from the capacitor of portion 804. In some cases, Vsig leaking across 808 may affect the output of comparator 818.

Figure 9:
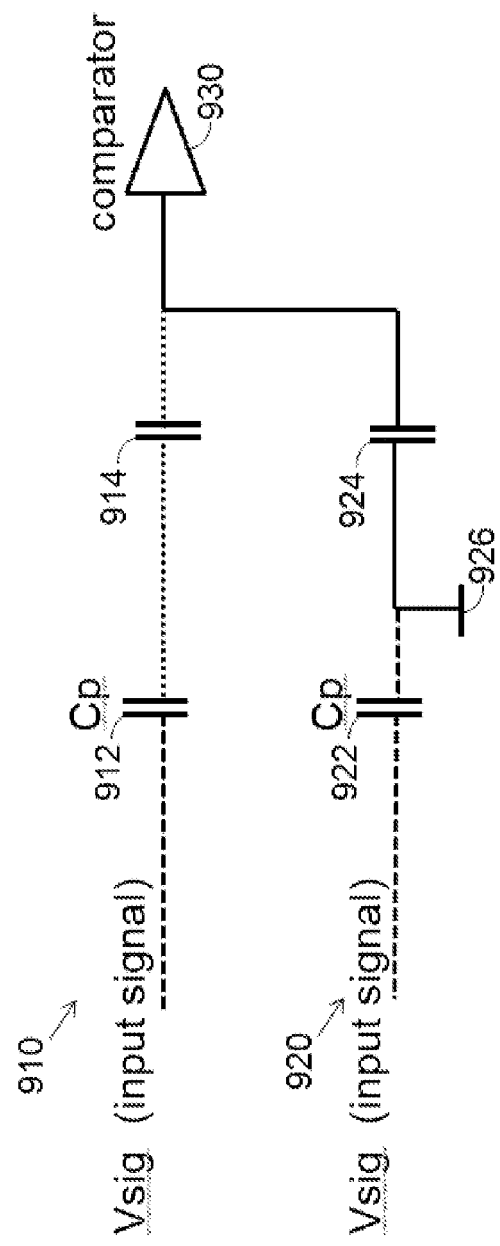
FIG. 9 is a circuit diagram of two example signal input paths.

FIG. 9 is a circuit diagram of two example signal input paths 910, 920. Path 910 includes parasitic capacitor 912 and capacitor 914 which outputs to comparator 930. The signal leakage across capacitor 912 may inhibit the floating of capacitor 914. A residue of Vsig may be present in the output of 914.

Path 920 includes parasitic capacitor 922 and capacitor 924 which outputs to comparator 930. Path 920 further includes ground 926 which holds a terminal of capacitor 924 at ground. Vsig may leak across capacitor 922. The ground 926 may allow capacitor 924 to float in the presence of Vsig leakage. A residue of Vsig may not be present at the output of 924.

Figure 10:
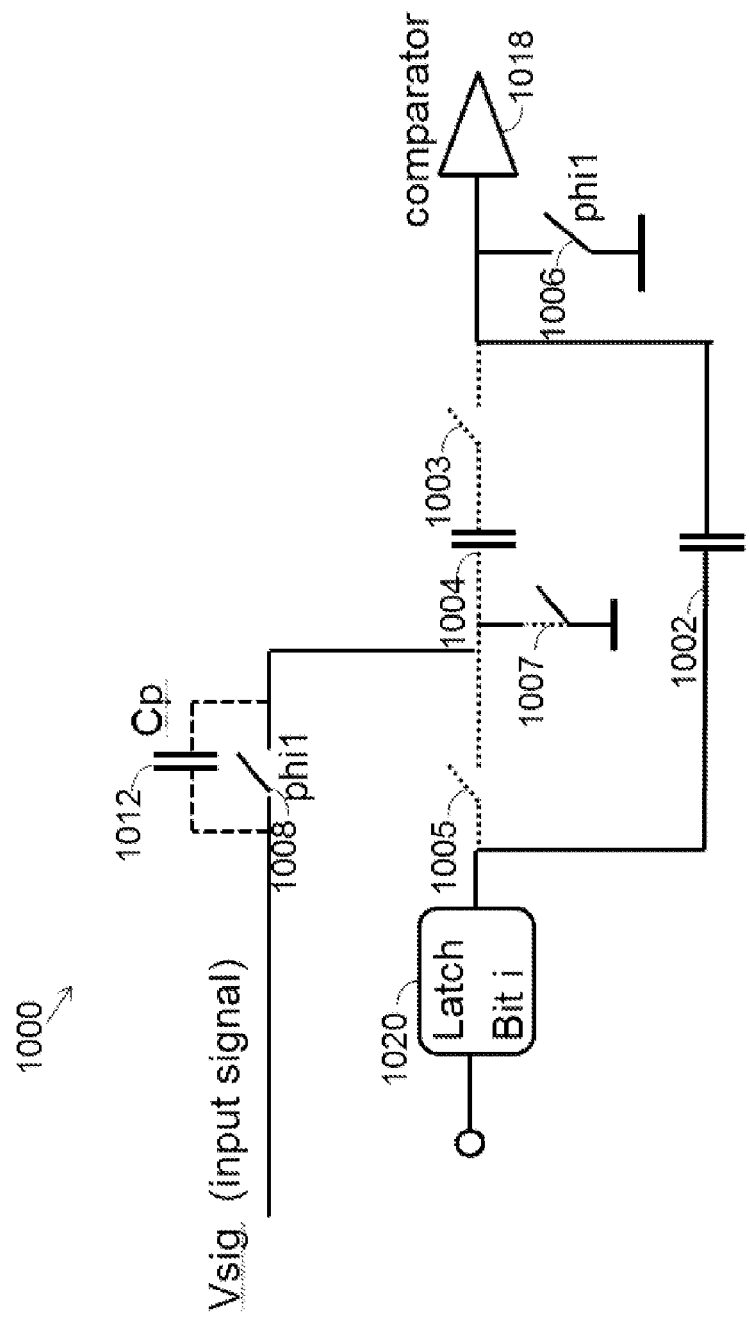
FIG. 10 is a circuit diagram of an example SC-DAC.

FIG. 10 is a circuit diagram of an example SC-DAC 1000. The example SC-DAC 1000 includes a latch 1020 which drives a portion 1002 that is engaged for a number of SAR steps and a portion 1004 that is disengaged for the number of SAR steps. During the track phase (phi 1) switches 1008 and 1006 are engaged. During the measurement phase switches 1008 and 1006 are disengaged. When disengaged, switch 1008 may act as a parasitic capacitor 1012 (Cp). Switch 1005 may be disengaged during the first number of SAR steps. In some cases, switch 1005 alone may not prevent residues of Vsig from affecting the output of comparator 1018.

Alternatively or additionally, one or more of switches 1003 and 1007 may be added. Switch 1003 may further inhibit the path from parasitic capacitor 1012 to comparator 1018. When engaged, switch 1007 may facilitate holding a terminal of the capacitor of portion 1004 at ground. In some implementations, switch 1007 may be engaged during the first number of SAR steps, and switches 1003 and 1005 may be disengaged during the first few SAR steps. In various implementations, a delayed clock may engage switches 1003 and 1005 and may disengage switch 1007.

Figure 11:
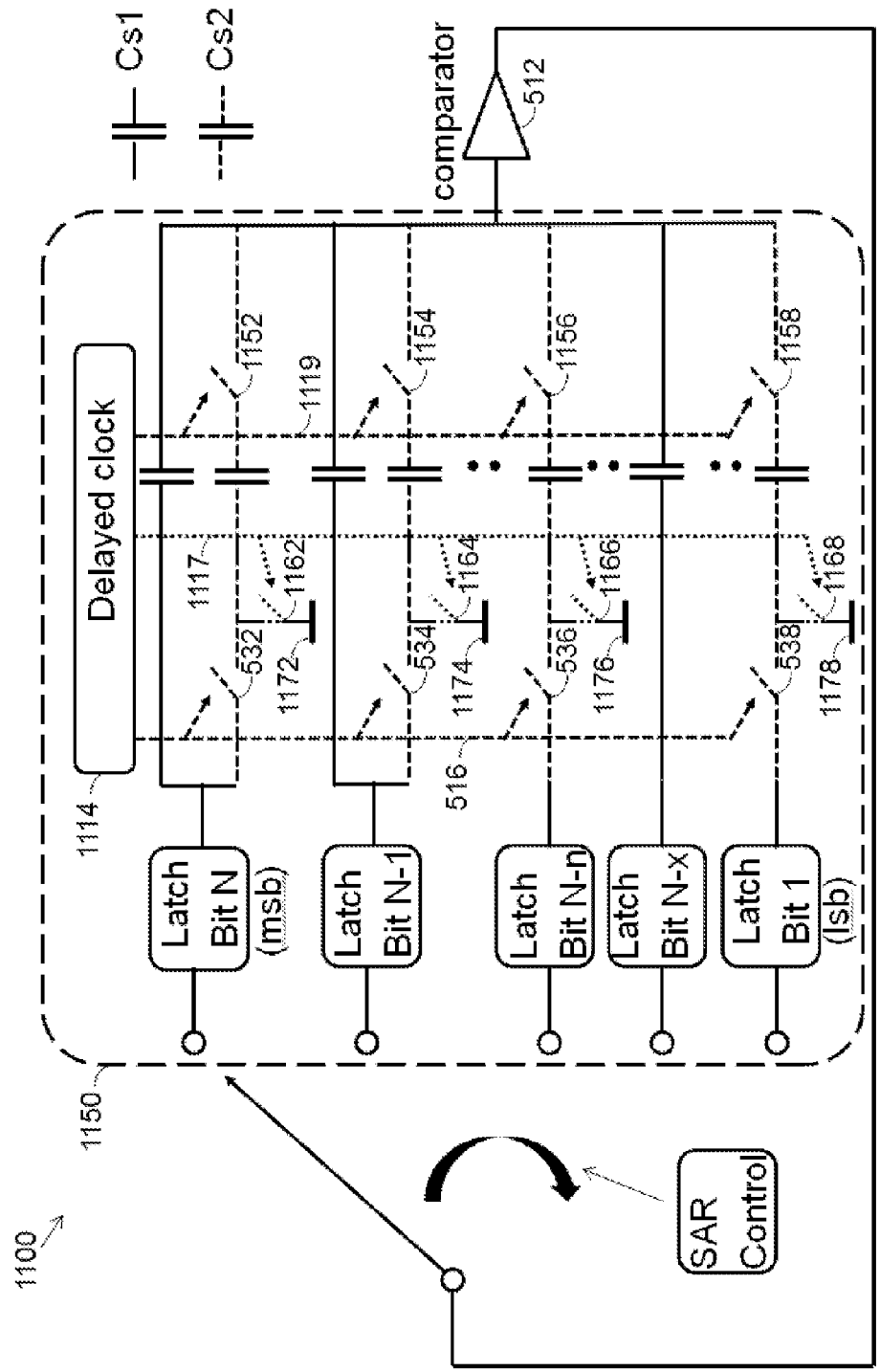
FIG. 11 is a circuit diagram of an example SC-DAC SAR.

FIG. 11 is a circuit diagram of an example SC-DAC SAR 1100. In various implementations the operation of the example SC-DAC 1150 may be similar to the operation of the example SC-DAC 550. In example SC-DAC 1150, includes switches 1152, 1154, 1156, 1158, 1162, 1164, 1166, 1168 and ground terminals 1172, 1174, 1176, 1178. In various implementations, delayed clock 1114 may produce switching signals 516, 1119 such that switches 532, 534, 536, 538, 1152, 1154, 1156, 1158 are disengaged during the first number of SAR steps (e.g. n steps), and engaged for the remaining SAR steps. In some cases, delayed clock 1114 may produce signal 1117 such that switches 1162, 1164, 1166, 1168 are engaged during the first n SAR steps and disengaged during the remaining SAR steps. Switches 1152, 1154, 1156, 1158, 1162, 1164, 1166, 1168 may facilitate mitigation of contributions from residues of the signal input to the SC-DAC SAR 1100. In some implementations, switching signals 516 and 1119 may include a common signal and signal 1117 may include the common signal phase-shifted by $\pi$ (180°).

In various implementations, capacitors in SAR systems may be switched from a "1" state to a "0" state (or vice versa). In some cases a switching event may include switching a terminal of a capacitor from a ground to a reference buffer (or vice versa). Switching events may be associated with power draws. In some cases, switching a larger capacitor may result in a larger power draw.

In various implementations, a SAR system may perform a binary search (or other search type for different radix) when determining a bit representation. A midcode comparison may be used. For example, for a bit with an associated capacitor of value 16 C a comparator may determine if a relative switching of +8 C or −8 C may occur. In some cases, a particular relative shift may be possible through differential switching (e.g. +4 C by switching +8 C and −40 (12 C total is switched)). Differential switching may be associated with a larger power draw than switching a capacitance of appropriate size in one direction.

Figure 12:
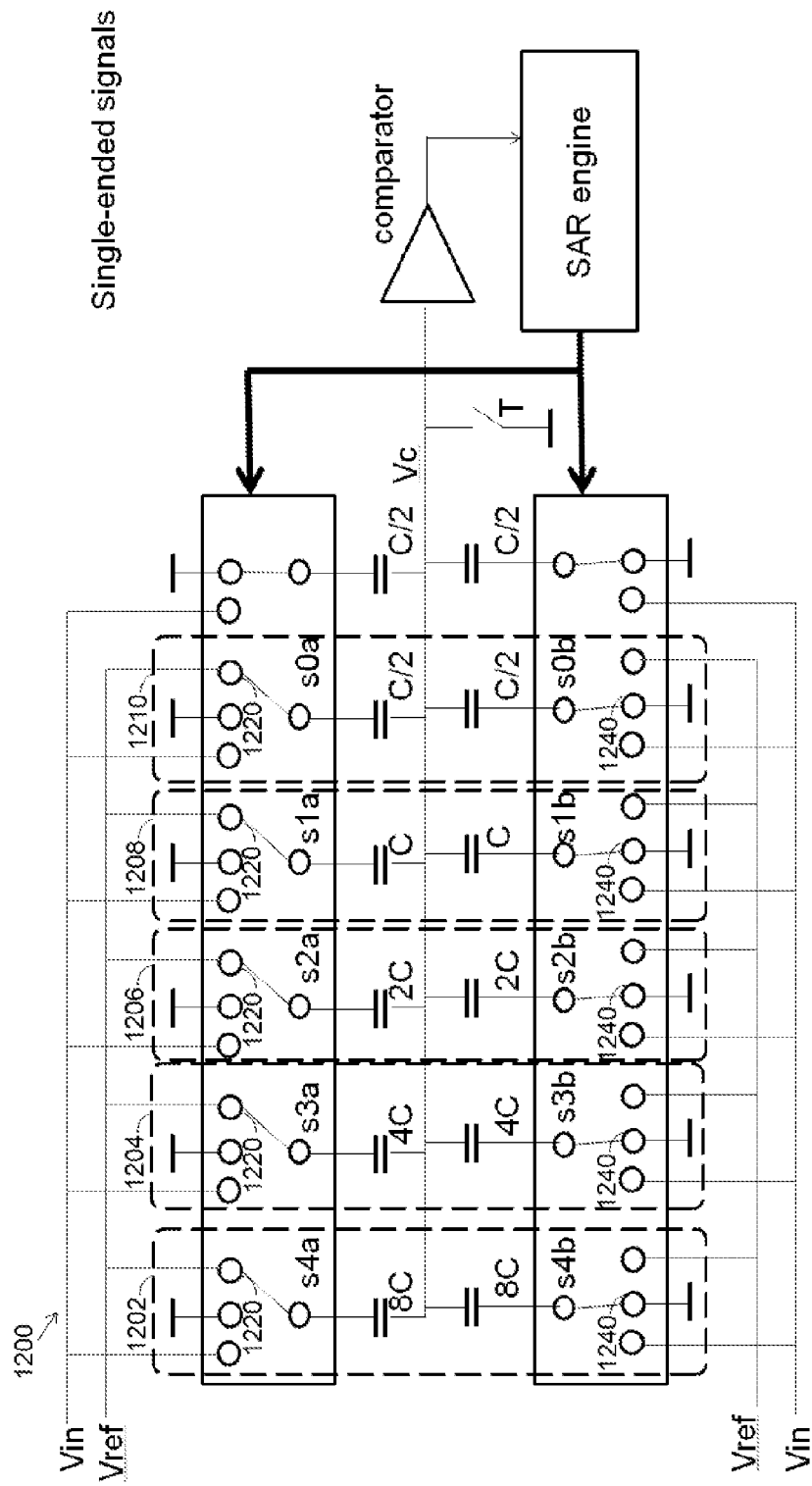
FIG. 12 is a circuit diagram of example split-capacitance DAC SAR.

FIG. 12 is a circuit diagram of example split-capacitance DAC SAR 1200. The example split-capacitance DAC SAR 1200 has a radix of 2. In some implementations, other radix may be used. In various implementations, the capacitance associated with a given bit 1202, 1204, 1206, 1208, 1210 may be divided into two equal portions (e.g. s4a and s4b). At the start of a SAR frame half the capacitance for a bit may be in the "1" position 1220 (e.g. connected to Vref) and the other half of the capacitance for the bit may be in the "0" position 1240 (e.g. connected to ground). Example starting positions for bits 1202, 1204, 1206, 1208, 1210 are shown. From the half "1" and half "0" initialization position, half the capacitance for the bit may be switched in either direction. For example in bit 1202, a relative switch of +8 from the starting position may be achieved by switching half s4b to the "1" position 1220. A relative switch of −8 may be achieved by switching half s4a to the "0" position 1240. In some cases, this half capacitance switching may reduce usage of differential switching.

FIG. 13 is a table 1300 of capacitor positions for an example split-capacitance SAR. The example split-capacitance SAR has 9-bits and an average radix of 1.72. The "value" column lists the relative capacitances of associated with the bits. For example, bit "8" has an associated capacitance of 56 C and bit "4" has an associated capacitance of 6 C. The example split-capacitance SAR uses 10 determination steps a midcode step follow by 9 SAR bit determination steps. For the steps a switching position is listed for the bits. A position of "10" indicate half of the associated capacitance in the "1" position and half of the associated capacitance in the "0" position. For example, during the midcode step bit "8" may be in position "10". This may indicate that of the total 56 C associated with bit "8", 28 C is in position "1" and the other 28 C is in position "0". After determination, a bit may be in position "11/00". This may indicate that the associated capacitance of a bit is in position "1" or it is in position "0". For example, at step 2 bit "8" may be in position "11/00". This may indicate that of the total 56 C associated with bit "8", 56 C may be in position "1" or 56 C may be in position "0". The black boxes surrounding some instances of "11/00" may indicate the bit being switched in a particular step. A "fixed" bit may be included to achieve a particular total capacitance. For example, in a system of radix 2 the total capacitance of the bits may sum to $(2^N-1)C$. The "fixed" bit may be included to make the total capacitance $2^N$ C. Alternatively or additionally, a "fixed" bit may also be used in processes (e.g. error checking, etc.) external to the DAC and/or SAR. In various implementations, a "fixed" bit may not be switched from its initial position.

Figure 14:
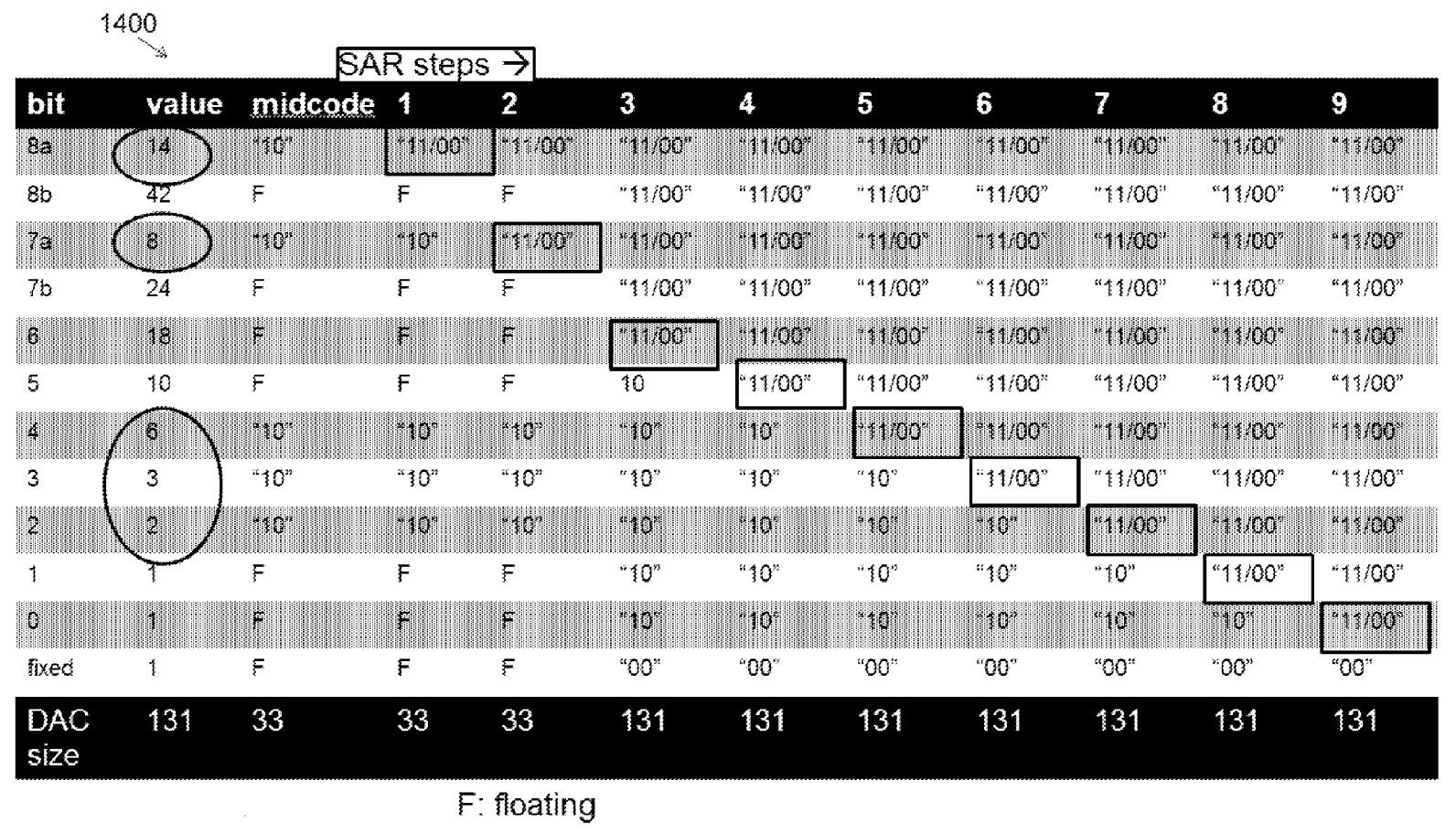

In various implementations, the split-capacitance design may be integrated with the SC-DAC SAR. In some cases, the capacitance associated with some bits and a portion of the capacitance associate with some bits may be allowed to float for the first number of SAR steps. FIG. 14 is a table 1400 of capacitor positions for an example split capacitance SC-DAC SAR. For the example split capacitance SC-DAC SAR, bits "0", "1", "5", and "6" are allowed to float for the midcode step and the first 2 SAR bit determination steps. Portions of the capacitance for bits "7" and "8" are allowed to float ("7b" and "8b"). The portions "7b" and "8b" may correspond to ¾ of the total capacitance associated with bits "7" and "8". To ensure that engaged portion of bits "7" and "8" ("7a" and "8a") have the proper weights bits "2", "3" and "4" are engaged for the midcode step and first 2 SAR bit determination steps. The total portion allowed to float corresponds to about ¾ of the total capacitance (98/131). The capacitances associated with the bits may be divided in two equal halves to facilitate split capacitance implementation. The portions "7a" and "8a" may also be divided into two equal halves to facilitate "10" positioning. In various implementations, the portions "7b" and "8b" may not be divided into halves, because they may be in position "11/00" when engaged and not in position "10". In some implementations, portions "7b" and "8b" may be divided into equal halves.

In various implementations, the "fixed" bit may be allowed to float for the first number of SAR steps. In some implementations, the "fixed" bit may be included in the bits that are engaged for the first number of SAR steps.

The portions, radix, bit numbers, and capacitances used in the examples may be illustrative of the principles and architectures discussed. In various implementations, other portions, radix, bit numbers, and capacitances may be used.

Figure 15:
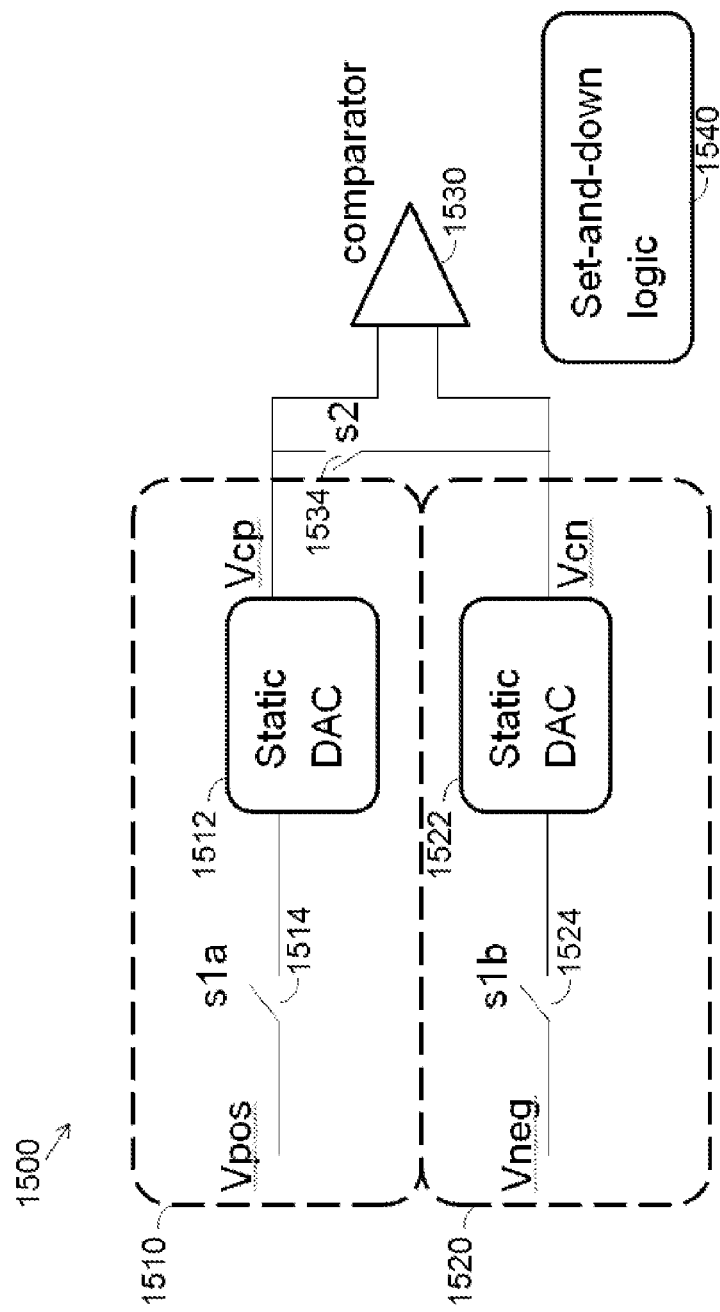
FIG. 15 is a circuit diagram of an example set-and-down SAR.

In some cases, power savings may be achieved by driving the comparator of the SAR in a single-ended configuration. FIG. 15 is a circuit diagram of an example set-and-down SAR 1500. The example set-and-down SAR may have two branches 1510, 1520. The positive branch 1510 may receive a positive version of the input signal (Vpos) during a track phase. The negative branch 1520 may receive a negative version, e.g. with opposite polarity, of the input signal (Vneg) during a track phase. During the track phase, switches 1514, 1524, 1534 may be engaged. During the measurement phase, switches 1514, 1524, 1534 may be disengaged. Switch 1534 may act as a differential short between the static DACs 1512, 1522 During the measurement phase, the capacitors of the DACs may be driven to the up state initially, e.g. capacitors connected to a reference voltage. The static DAC 1512 may output Vcp, and static DAC 1552 may output Vcn. The comparator 1530 may determine which of Vcp and Vcn has a larger magnitude. The set-and-down logic 1540 may then cause one of the static DACs to switch downward for a given bit. In various implementations, if static DAC 1512 switches downward a "1" may be assigned. If static DAC 1522 switches downward a "0" may be assigned.

Figure 16:
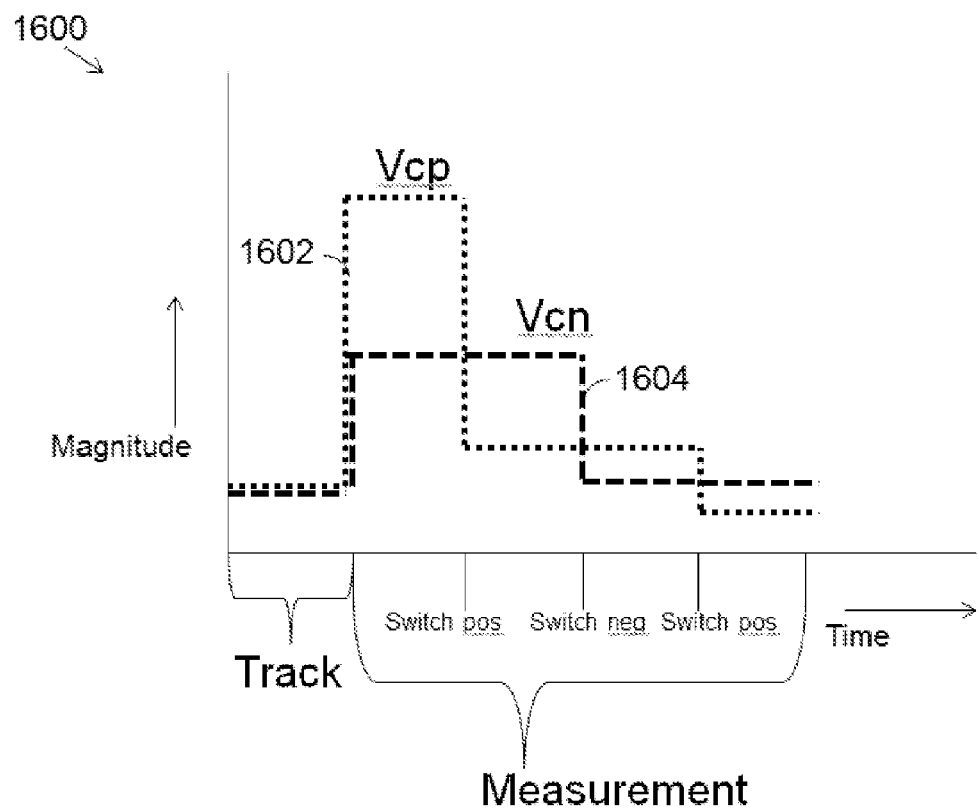
FIG. 16 is a plot of an example signal progression for an example set-and-down SAR.

FIG. 16 is a plot 1600 of an example signal progression for an example set-and-down SAR. The output signals Vcp 1602 and Vcn 1604 change as the corresponding DACs are switched.

Figure 17:
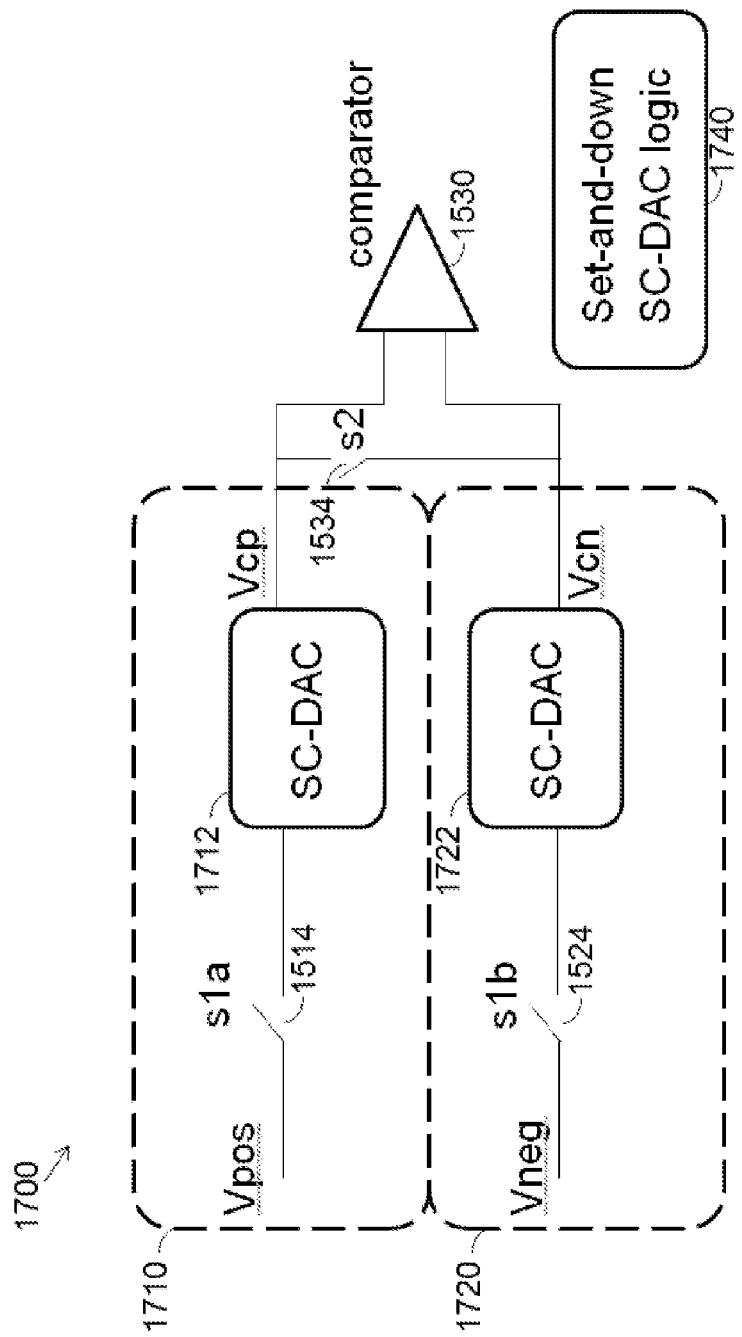
FIG. 17 is a circuit diagram of an example SC-DAC set-and-down SAR.

In some implementations, the set-and-down configuration may be combined with SC-DACs. FIG. 17 is a circuit diagram of an example SC-DAC set-and-down SAR 1700. The operation of the example SC-DAC set-and-down SAR 1700 may be similar to that of the example set-and-down SAR 1500. The braches 1710, 1720 may include SC-DACs 1712, 1722. For the first number of SAR steps, the SC-DACs 1712, 1722 may allow a portion of their total capacitance to float. The smaller portion of engaged capacitance may be associated with smaller power draws. As discussed above with respect to the operation of the example set-and-down SAR 1500, the set-and-down SC-DAC logic 1740 may then cause one of the static DACs to switch downward based on the output of the comparator 1530. In various implementations, if static DAC 1712 switches downward a "1" may be assigned. If static DAC 1722 switches downward a "0" may be assigned. The set-and-down SC-DAC logic 1740 may further implement a delayed clock to disengage portions of the capacitances of the SC-DACs 1712, 1722 during the first number of SAR steps, and to engage portions of the capacitances of the SC-DACs 1712, 1722 during the remaining SAR steps.

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

While various implementations have been described, many more embodiments and implementations are possible. Accordingly, the description is not to be restricted.

What is claimed is:

1. A system, comprising:
   a first capacitor group to facilitate determination of a first bit;
   a second capacitor group to, in combination with the first capacitor group, facilitate determination of a second bit; and
   a delayed clock switch to engage the second capacitor group after determination of the first bit.

2. The system of claim 1, where the first bit comprises a most significant bit.

3. The system of claim 1, where the second bit comprises a least significant bit.

4. The system of claim 1, where the first capacitor group comprises a first capacitor paired with a second capacitor in the second capacitor group.

5. The system of claim 4, where the first capacitor has less capacitance than the second capacitor.

6. The system of claim 4, where the first capacitor is situated in parallel with the second capacitor.

7. The system of claim 4, further comprising a latch to drive the first and second capacitors.

8. The system of claim 4, where the first capacitor comprises a set of unitary capacitors situated in parallel.

9. The system of claim 4 where a first ratio of the capacitance of the first capacitor to the capacitance of the first capacitor group is similar to a second ratio of the capacitance of the first and second capacitors to the capacitance of the first and second capacitor groups.

10. The system of claim 4, further comprising a split-capacitance analog-to-digital converter; and
    where the first capacitor group further comprises a third capacitor with a capacitance equal to a capacitance of the first capacitor;
    where the first capacitor is configured to initialize in a logical high state; and
    where the third capacitor is configured to initialize in a logical low state.

11. The system of claim 1 comprising an analog-to-digital converter with sampling cycle and an associated sampling frequency, and the delayed clock switch is configured to operate at the sampling frequency.

12. The system of claim 1, further comprising a second delayed clock switch to disengage the second capacitor group from a ground.

13. A method, comprising:
    determining a first number of bits based on a first capacitor group;
    receiving a delayed clock signal;
    engaging a second capacitor group based on the delayed clock signal; and
    determining a second number of bits based on the first and second capacitor groups.

14. The method of claim 13, further comprising engaging a latch to drive a first capacitor of the first group and a second capacitor of the second group.

15. The method of claim 14, further comprising:
    operating the first capacitor in a engaged state prior to reception of the delayed clock signal; and
    operating the second capacitor in a disengaged state prior to reception of the delayed clock signal.

16. The method of claim 15, further comprising, prior to reception of the delayed clock signal, determining a most significant bit based on the engaged state of the first capacitor and the disengaged state of the second capacitor.

17. The method of claim 13, further comprising:
    sampling a positive signal via the first capacitor group;
    sampling a negative signal via a third capacitor group;
    generating a positive output based on the first capacitor group;
    generating a negative output based on the third capacitor group;
    comparing the positive and negative outputs;
    based on the comparison, switching a capacitor within the first group or third group to a logical low; and
    based on the switching, determining a bit assignment.

18. A device, comprising:
    a first latch associated with a most significant bit (MSB);
    a second latch associated with a least significant bit (LSB);
    a delayed clock configured to generate a delayed clock signal after a determination of the MSB and prior to a determination of the LSB;
    a first capacitor configured to be engaged prior to generation of the delayed clock signal, the first capacitor configured to be driven by the first latch;
    a second capacitor configured to be disengaged prior to generation of the delayed clock signal, the second capacitor configured to be driven by the second latch;
    a third capacitor configured to be disengaged prior to generation of the delayed clock signal the third capacitor configured to be driven by the first latch; and
    a controller configured to engage the second and third capacitors in response to the generation of the delayed clock signal.

19. The device of claim 18, where the determination of the MSB configured to be based on a switching state of the first and third capacitors.

20. The device of claim 18, where a first ratio of a capacitance of the first capacitor to a fractional capacitance corresponds to a weight; and
    where a second ratio of the capacitance of the first capacitor and a capacitance of the third capacitor to a total capacitance corresponds to the weight.

* * * * *